United States Patent
Flores Renteria et al.

(10) Patent No.: US 10,465,535 B2
(45) Date of Patent: Nov. 5, 2019

(54) COMPRESSOR BLADE OR VANE HAVING AN EROSION-RESISTANT HARD MATERIAL COATING

(71) Applicant: Siemens Aktiengesellschaft, München (DE)

(72) Inventors: Arturo Flores Renteria, Berlin (DE); Torsten Neddemeyer, Falkensee (DE)

(73) Assignee: Siemens Aktiengesellschaft (DE)

(*) Notice: Subject to any disclaimer, the term of this patent is extended or adjusted under 35 U.S.C. 154(b) by 0 days.

(21) Appl. No.: 15/115,334

(22) PCT Filed: Jan. 8, 2015

(86) PCT No.: PCT/EP2015/050225
§ 371 (c)(1),
(2) Date: Jul. 29, 2016

(87) PCT Pub. No.: WO2015/121000
PCT Pub. Date: Aug. 20, 2015

(65) Prior Publication Data
US 2017/0009591 A1   Jan. 12, 2017

(30) Foreign Application Priority Data
Feb. 14, 2014 (EP) .................... 14155135

(51) Int. Cl.
*C23C 10/60* (2006.01)
*F01D 5/28* (2006.01)
(Continued)

(52) U.S. Cl.
CPC ............... *F01D 5/288* (2013.01); *C23C 4/02* (2013.01); *C23C 4/10* (2013.01); *C23C 4/134* (2016.01);
(Continued)

(58) Field of Classification Search
CPC ... C23C 10/00–60; C23C 10/08; C23C 10/20; C23C 10/48; C23C 10/60
See application file for complete search history.

(56) References Cited

U.S. PATENT DOCUMENTS 5,514,482 A * 5/1996 Strangman ................ C23C 4/02
427/383.7
6,024,792 A    2/2000 Kurz et al.
(Continued)

FOREIGN PATENT DOCUMENTS

EP    0486489 B1    11/1994
EP    0718419 A2    6/1996
(Continued)

OTHER PUBLICATIONS

International Search Report for PCT/EP2015/050225, dated Apr. 16, 2015.

*Primary Examiner* — Elizabeth A Burkhart
(74) *Attorney, Agent, or Firm* — Schmeiser, Olsen & Watts LLP

(57) ABSTRACT

A compressor blade for a gas turbine is provided. The compressor blade has a blade substrate that consists of a metal alloy and has an aluminum diffusion zone on a surface of the blade substrate. In addition, the compressor blade has a hard material coating provided on the surface of the blade substrate. A compressor that has a compressor blade and a method of producing such a compressor blade is also provided.

5 Claims, 3 Drawing Sheets

(51) Int. Cl.

| | | |
|---|---|---|
| *C23C 4/02* | (2006.01) | |
| *C23C 4/10* | (2016.01) | |
| *C23C 14/06* | (2006.01) | |
| *C23C 28/00* | (2006.01) | |
| *F01D 11/12* | (2006.01) | |
| *C23C 14/02* | (2006.01) | |
| *C23C 4/134* | (2016.01) | |
| *C23C 10/04* | (2006.01) | |
| *C23C 14/24* | (2006.01) | |
| *F01D 9/04* | (2006.01) | |
| *F04D 29/32* | (2006.01) | |

(52) U.S. Cl.
CPC .............. *C23C 10/04* (2013.01); *C23C 10/60* (2013.01); *C23C 14/025* (2013.01); *C23C 14/0641* (2013.01); *C23C 14/24* (2013.01); *C23C 28/321* (2013.01); *C23C 28/347* (2013.01); *F01D 9/041* (2013.01); *F01D 11/122* (2013.01); *F04D 29/324* (2013.01); *F05D 2220/32* (2013.01); *F05D 2230/90* (2013.01); *F05D 2240/12* (2013.01); *F05D 2240/30* (2013.01); *F05D 2300/121* (2013.01); *F05D 2300/133* (2013.01); *F05D 2300/171* (2013.01); *F05D 2300/174* (2013.01); *F05D 2300/212* (2013.01); *F05D 2300/228* (2013.01); *F05D 2300/2281* (2013.01); *F05D 2300/2284* (2013.01); *F05D 2300/506* (2013.01); *Y02T 50/673* (2013.01)

(56) References Cited

U.S. PATENT DOCUMENTS

| | | | |
|---|---|---|---|
| 6,482,470 B1* | 11/2002 | Reeves | .................. C23C 10/08 |
| | | | 427/253 |
| 2009/0011195 A1 | 1/2009 | Bruce | |
| 2010/0226783 A1* | 9/2010 | Lipkin | ..................... C23C 4/06 |
| | | | 416/241 B |
| 2011/0052406 A1 | 3/2011 | Bruce | |
| 2011/0300405 A1* | 12/2011 | Goller | ..................... C23C 10/20 |
| | | | 428/650 |

FOREIGN PATENT DOCUMENTS

| | | |
|---|---|---|
| EP | 0412397 B1 | 3/1998 |
| EP | 0892090 A1 | 1/1999 |
| EP | 0786017 B1 | 3/1999 |
| EP | 1306454 | 5/2003 |
| EP | 1319729 A1 | 6/2003 |
| EP | 1204776 B1 | 6/2004 |
| EP | 2684982 A1 | 1/2014 |
| WO | 9967435 A1 | 12/1999 |
| WO | 0044949 A1 | 8/2000 |

* cited by examiner

COMPRESSOR BLADE OR VANE HAVING AN EROSION-RESISTANT HARD MATERIAL COATING

CROSS-REFERENCE TO RELATED APPLICATIONS

This application claims priority to PCT Application No. PCT/EP2015/050225, having a filing date of Jan. 8, 2015, based off of European application No. EP 14155135.8 having a filing date of Feb. 14, 2014, the entire contents of which are hereby incorporated by reference.

FIELD OF TECHNOLOGY

The following relates to a compressor blade or vane for a gas turbine, to a compressor having such a compressor blade or vane, and to a method for producing such a compressor blade or vane.

BACKGROUND

In the case of gas turbines, what is termed "wet compression" involves water being added into the combustion air compressed by a compressor, this leading to an increase in the efficiency of the gas turbine on account of the resultant cooling effect and the increase in the mass flow in the gas turbine. The water is atomized to the finest possible extent, but the droplets in the combustion air lead to erosion on the compressor blades or vanes. The moisture additionally brings about increased corrosion. To date, compressor blades or vanes have been coated with corrosion-resistant layers such as Sicoat 8610, but these do not afford adequate erosion protection.

Thus a need exists for a robust compressor blade or vane which can withstand the increased erosion loading during the wet compression method for a longer period of time.

SUMMARY

Embodiments of the invention therefore introduce a compressor blade or vane for a gas turbine. The compressor blade or vane has a blade or vane substrate, which consists of a metal alloy and has an aluminum diffusion zone on a surface of the blade or vane substrate. Moreover, the compressor blade or vane has a hard material coating arranged on the surface of the blade or vane substrate.

The compressor blade or vane according to embodiments of the invention has the advantage of greater erosion resistance on account of the hard material coating applied to the blade or vane substrate. The hard material coating also affords corrosion protection. A problem with such hard material coatings, however, is that they can spall locally. At a site of the blade or vane substrate which is exposed in this way, this can lead to the onset of corrosion, and this promotes the further spalling of the hard material coating by undercorrosion. As a result of the spalling, the compressor blade or vane will finally succumb to erosion. Embodiments of the invention solve this problem by virtue of an aluminum diffusion layer; upon spalling of the hard material coating, the aluminum present in this aluminum diffusion layer reacts to form aluminum oxide, which protects the metal alloy of the blade or vane substrate against corrosion. Undercorrosion, which can eventually result in destruction of the blade or vane, is prevented in this way.

The hard material coating preferably consists of TiN, TiAlN, AlTiN, CrN as single-layer or multi-layer ceramics or comprises TiN, TiAlN, AlTiN, CrN as single-layer or multi-layer ceramics. As a hard material coating, these materials afford a particularly high resistance to erosion and corrosion loading.

The aluminum diffusion zone can have a thickness of 10 to 30 micrometers, preferably of 15 to 25 micrometers. An aluminum diffusion zone having a thickness of approximately 20 micrometers can take up enough aluminum in order to protect the compressor blade or vane coated with hard material according to embodiments of the invention from corrosion over the course of at least 100,000 operating hours.

The aluminum diffusion zone of the compressor blade or vane can have an aluminum proportion of 0.05 to 0.2% by weight, preferably of 0.075 to 0.15% by weight. An aluminum proportion of approximately 0.1% by weight provides enough aluminum to ensure reliable corrosion protection for the compressor blade or vane coated with hard material according to embodiments of the invention. Depending on the respective operating conditions, however, a person skilled in the art can determine suitable layer thicknesses, aluminum proportions and/or diffusion profiles by modeling for the respective individual case.

The metal alloy of the compressor blade or vane is preferably a creep-resistant steel, for example a creep-resistant steel in accordance with EN 10302:2008. One example of a suitable steel is X22CrNiMoV12-1. Creep-resistant steels are an inexpensive material which withstands the high mechanical loading to which a compressor blade or vane of a gas turbine is subjected during operation at the only moderate temperatures which prevail there.

A second aspect of the invention relates to a compressor for a gas turbine having a plurality of compressor blades or vanes, of which at least one compressor blade or vane is designed according to the first aspect of the invention.

The plurality of compressor blades or vanes can be arranged in a plurality of rows, wherein each row has a plurality of compressor blades or vanes arranged transversely to a main direction of flow of the compressor. Moreover, the rows can be arranged adjacent along the main direction of flow. It is preferable here that the compressor blades or vanes of the first to fourth row of compressor blades or vanes along the main direction of flow are designed according to the first aspect of the invention. The compressor blades or vanes of the first to fourth row of the compressor are exposed to the erosion to the greatest extent, and for this reason the compressor blades or vanes according to embodiments of the invention can be used here in a particularly advantageous manner.

A further aspect of the invention introduce a method for producing a compressor blade or vane according to embodiments of the invention. The method comprises at least the following steps:

provision of a blade or vane substrate consisting of a metal alloy;

diffusion of aluminum into a surface zone of the blade or vane substrate; and coating of the blade or vane substrate with a hard material coating.

It is preferable here that, in the step involving the diffusion of aluminum into the surface zone, an aluminum diffusion zone having a thickness of 10 to 30 micrometers, preferably of 15 to 25 micrometers, is produced.

In one advantageous embodiment of the method according to the invention, the step involving the diffusion of aluminum into the surface zone is carried out in such a manner that an aluminum proportion of 0.05 to 0.2% by weight, preferably of 0.075 to 0.15% by weight, is present in the surface zone.

In the step involving the coating of the blade or vane substrate with a hard material coating, a step of physical vapor deposition or of thermal plasma spraying can be carried out.

BRIEF DESCRIPTION

Some of the embodiments will be described in detail, with reference to the following figures, wherein like designations denote like members, wherein.

DETAILED DESCRIPTION

Figure 1:
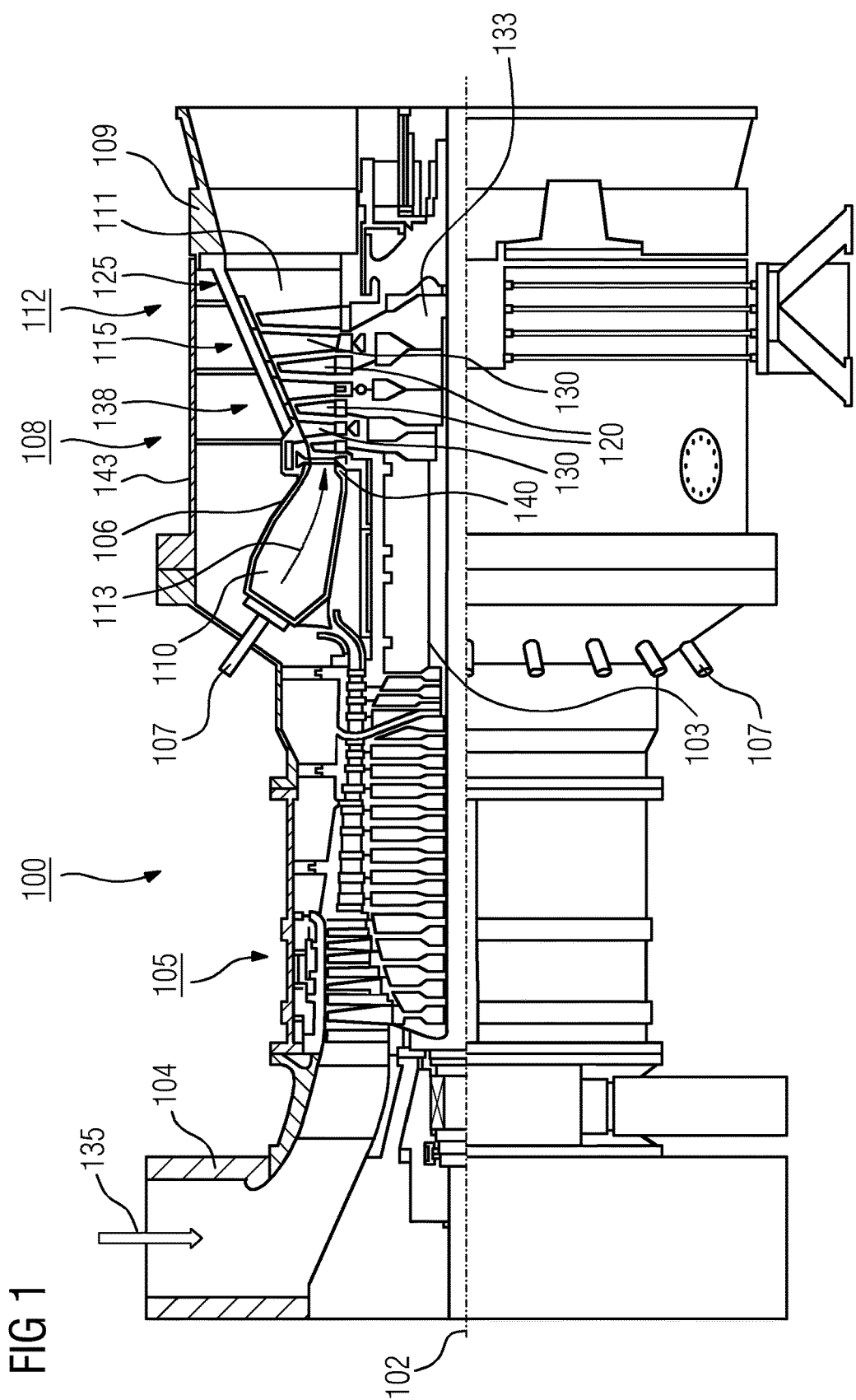
FIG. 1 shows a partial longitudinal section through an exemplary gas turbine.

FIG. 1 shows, by way of example, a partial longitudinal section through a gas turbine 100.

In the interior, the gas turbine 100 has a rotor 103 with a shaft 101 which is mounted such that it can rotate about an axis of rotation 102 and is also referred to as the turbine rotor.

An intake housing 104, a compressor 105, a, for example, toroidal combustion chamber 110, in particular an annular combustion chamber, with a plurality of coaxially arranged burners 107, a turbine 108 and the exhaust-gas housing 109 follow one another along the rotor 103.

The annular combustion chamber 110 is in communication with a for example annular hot gas duct 111. There, for example four series-connected turbine stages 112 form the turbine 108.

Each turbine stage 112 is formed, for example, from two blade or vane rings. As seen in the direction of flow of a working medium 113, in the hot gas duct 111 a row of guide vanes 115 is followed by a row 125 formed from rotor blades 120.

The guide vanes 130 are secured to an inner housing 138 of a stator 143, whereas the rotor blades 120 of a row 125 are fitted to the rotor 103 for example by means of a turbine disk 133.

A generator (not shown) is coupled to the rotor 103.

While the gas turbine 100 is operating, the compressor 105 sucks in air 135 through the intake housing 104 and compresses it. The compressed air provided at the turbine-side end of the compressor 105 is passed to the burners 107, where it is mixed with a fuel. The mix is then burnt in the combustion chamber 110, forming the working medium 113. From there, the working medium 113 flows along the hot gas duct 111 past the guide vanes 130 and the rotor blades 120. The working medium 113 expands at the rotor blades 120, imparting its momentum, so that the rotor blades 120 drive the rotor 103 and the latter drives the generator coupled to it.

While the gas turbine 100 is operating, the components which are exposed to the hot working medium 113 are subject to thermal stresses. The guide vanes 130 and rotor blades 120 of the first turbine stage 112, as seen in the direction of flow of the working medium 113, together with the heat shield elements which line the annular combustion chamber 110, are subject to the highest thermal stresses.

To be able to withstand the temperatures which prevail there, they may be cooled by means of a coolant.

Substrates of the components may likewise have a directional structure, i.e. they are in single-crystal form (SX structure) or have only longitudinally oriented grains (DS structure).

By way of example, iron-based, nickel-based or cobalt-based superalloys are used as material for the components, in particular for the turbine blade or vane 120, 130 and components of the combustion chamber 110.

Superalloys of this type are known, for example, from EP 1 204 776 B1, EP 1 306 454, EP 1 319 729 A1, WO 99/67435 or WO 00/44949 .

The blades or vanes 120, 130 may likewise have coatings protecting against corrosion (MCrAlX; M is at least one element selected from the group consisting of iron (Fe), cobalt (Co), nickel (Ni), X is an active element and stands for yttrium (Y) and/or silicon, scandium (Sc) and/or at least one rare earth element, or hafnium). Alloys of this type are known from EP 0 486 489 B1, EP 0 786 017 B1, EP 0 412 397 B1 or EP 1 306 454 A1.

It is also possible for a thermal barrier layer to be present on the MCrAlX, consisting for example of $ZrO_2$, $Y_2O_3$-$ZrO_2$, i.e. unstabilized, partially stabilized or fully stabilized by yttrium oxide and/or calcium oxide and/or magnesium oxide.

Columnar grains are produced in the thermal barrier layer by suitable coating processes, such as for example electron beam physical vapor deposition (EB-PVD).

The guide vane 130 has a guide vane root (not shown here), which faces the inner housing 138 of the turbine 108, and a guide vane head, which is at the opposite end from the guide vane root. The guide vane head faces the rotor 103 and is fixed to a securing ring 140 of the stator 143.

Figure 2:
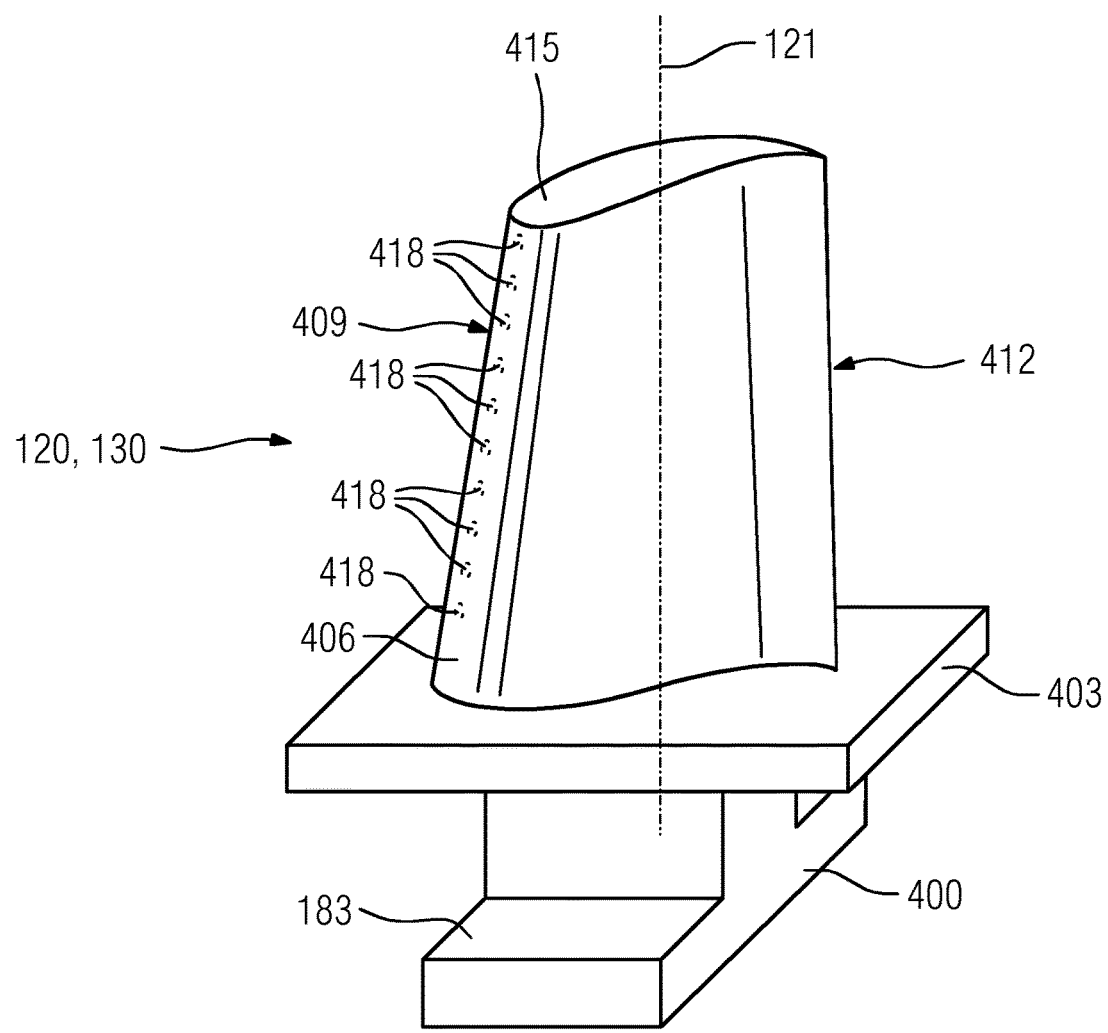
FIG. 2 shows a perspective view of an embodiment of a rotor blade or guide vane of a gas turbine.

FIG. 2 shows a perspective view of a rotor blade 120 or guide vane 130 of a turbomachine, which extends along a longitudinal axis 121.

The turbomachine may be a gas turbine of an aircraft or of a power plant for generating electricity, a steam turbine or a compressor.

The blade or vane 120, 130 has, in succession along the longitudinal axis 121, a securing region 400, an adjoining blade or vane platform 403 and a main blade or vane part 406 and a blade or vane tip 415.

As a guide vane 130, the vane 130 may have a further platform (not shown) at its vane tip 415.

A blade or vane root 183, which is used to secure the rotor blades 120, 130 to a shaft or a disk (not shown), is formed in the securing region 400.

The blade or vane root 183 is designed, for example, in hammerhead form. Other configurations, such as a fir-tree or dovetail root, are possible.

The blade or vane 120, 130 has a leading edge 409 and a trailing edge 412 for a medium which flows past the main blade or vane part 406.

In the case of conventional blades or vanes 120, 130, by way of example solid metallic materials, in particular superalloys, are used in all regions 400, 403, 406 of the blade or vane 120, 130.

Superalloys of this type are known, for example, from EP 1 204 776 B1, EP 1 306 454, EP 1 319 729 A1, WO 99/67435 or WO 00/44949.

The blade or vane 120, 130 may in this case be produced by a casting process, by means of directional solidification, by a forging process, by a milling process or combinations thereof Workpieces with a single-crystal structure or structures are used as components for machines which, in operation, are exposed to high mechanical, thermal and/or chemical stresses.

Single-crystal workpieces of this type are produced, for example, by directional solidification from the melt. This involves casting processes in which the liquid metallic alloy solidifies to form the single-crystal structure, i.e. the single-crystal workpiece, or solidifies directionally.

In this case, dendritic crystals are oriented along the direction of heat flow and form either a columnar crystalline grain structure (i.e. grains which run over the entire length of the workpiece and are referred to here, in accordance with the language customarily used, as directionally solidified) or a single-crystal structure, i.e. the entire workpiece consists of one single crystal. In these processes, a transition to globular (polycrystalline) solidification needs to be avoided, since non-directional growth inevitably forms transverse and longitudinal grain boundaries, which negate the favorable properties of the directionally solidified or single-crystal component.

Where the text refers in general terms to directionally solidified microstructures, this is to be understood as meaning both single crystals, which do not have any grain boundaries or at most have small-angle grain boundaries, and columnar crystal structures, which do have grain boundaries running in the longitudinal direction but do not have any transverse grain boundaries. This second form of crystalline structures is also described as directionally solidified structures.

Processes of this type are known from U.S. Pat. No. 6,024,792 and EP 0 892 090 A1.

The blades or vanes 120, 130 may likewise have coatings protecting against corrosion or oxidation, e.g. (MCrAlX; M is at least one element selected from the group consisting of iron (Fe), cobalt (Co), nickel (Ni), X is an active element and stands for yttrium (Y) and/or silicon and/or at least one rare earth element, or hafnium (Hf)). Alloys of this type are known from EP 0 486 489 B1, EP 0 786 017 B1, EP 0 412 397 B1 or EP 1 306 454 A1.

The density is preferably 95% of the theoretical density.

A protective aluminum oxide layer (TGO=thermally grown oxide layer) is formed on the MCrAlX layer (as an intermediate layer or as the outermost layer).

The layer preferably has a composition Co-30Ni-28Cr-8Al-0.6Y-0.7Si or Co-28Ni-24Cr-10Al-0.6Y. In addition to these cobalt-based protective coatings, it is also preferable to use nickel-based protective layers, such as Ni-10Cr-12Al-0.6Y-3Re or Ni-12Co-21Cr-11Al-0.4Y-2Re or Ni-25Co-17Cr-10Al-0.4Y-1.5Re.

It is also possible for a thermal barrier layer, which is preferably the outermost layer and consists for example of ZrO2, Y2O3-ZrO2, i.e. it is unstabilized, partially stabilized or fully stabilized by yttrium oxide and/or calcium oxide and/or magnesium oxide, to be present on the MCrAlX.

The thermal barrier layer covers the entire MCrAlX layer.

Columnar grains are produced in the thermal barrier layer by suitable coating processes, such as for example electron beam physical vapor deposition (EB-PVD).

Other coating processes are possible, e.g. atmospheric plasma spraying (APS), LPPS, VPS or CVD. The thermal barrier layer may include grains that are porous or have micro-cracks or macro-cracks, in order to improve the resistance to thermal shocks. The thermal barrier layer is therefore preferably more porous than the MCrAlX layer.

Refurbishment means that, after they have been used, protective layers may have to be removed from components 120, 130 (e.g. by sand-blasting). Then, the corrosion and/or oxidation layers and products are removed. If appropriate, cracks in the component 120, 130 are also repaired. This is followed by recoating of the component 120, 130, after which the component 120, 130 can be reused.

The blade or vane 120, 130 may be hollow or solid in form. If the blade or vane 120, 130 is to be cooled, it is at least partially hollow and may also have film-cooling holes 418 (indicated by dashed lines).

Figure 3:
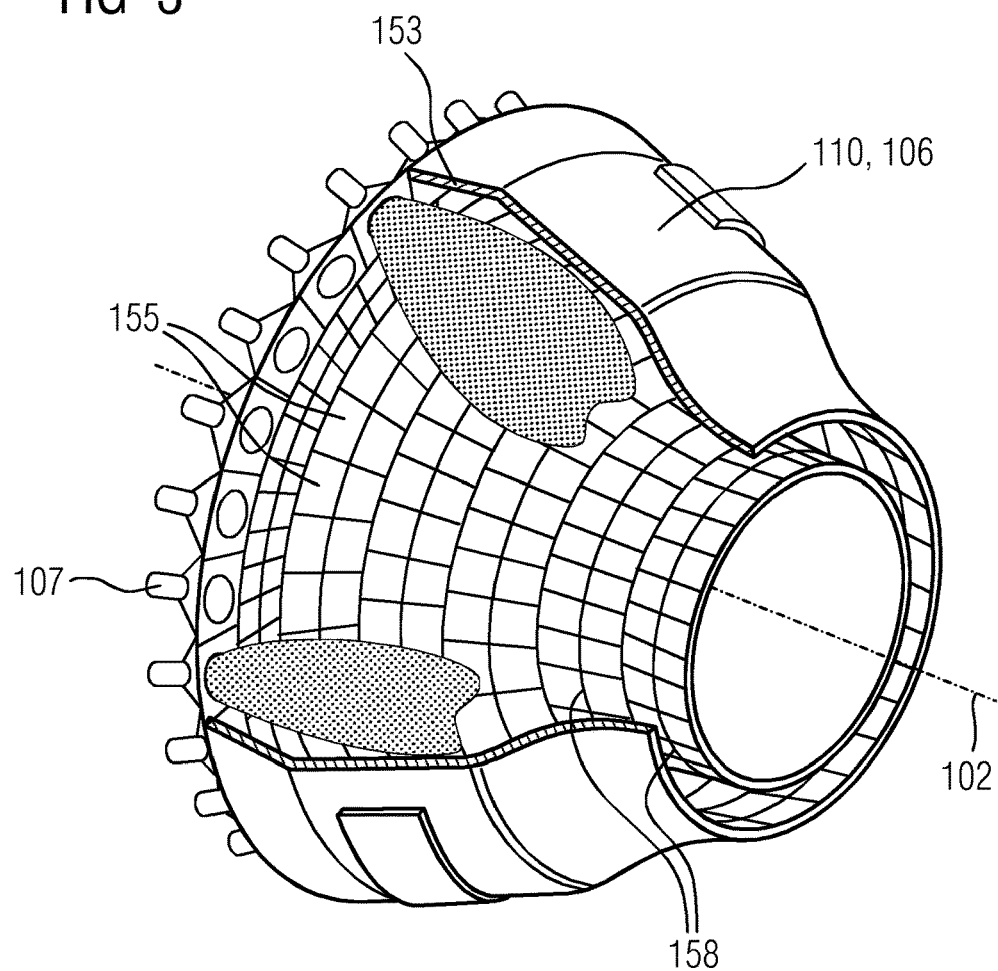
FIG. 3 shows an embodiment of a combustion chamber of a gas turbine.

FIG. 3 shows a combustion chamber 110 of a gas turbine. The combustion chamber 110 is configured, for example, as what is known as an annular combustion chamber, in which a multiplicity of burners 107, which generate flames 156, arranged circumferentially around an axis of rotation 102 open out into a common combustion chamber space 154. For this purpose, the combustion chamber 110 overall is of annular configuration positioned around the axis of rotation 102.

To achieve a relatively high efficiency, the combustion chamber 110 is designed for a relatively high temperature of the working medium M of approximately 1000° C. to 1600° C. To allow a relatively long service life even with these operating parameters, which are unfavorable for the materials, the combustion chamber wall 153 is provided, on its side which faces the working medium M, with an inner lining formed from heat shield elements 155.

On the working medium side, each heat shield element 155 made from an alloy is equipped with a particularly heat-resistant protective layer (MCrAlX layer and/or ceramic coating) or is made from material that is able to withstand high temperatures (solid ceramic bricks).

These protective layers may be similar to the turbine blades or vanes, i.e. for example MCrAlX: M is at least one element selected from the group consisting of iron (Fe), cobalt (Co), nickel (Ni), X is an active element and stands for yttrium (Y) and/or silicon and/or at least one rare earth element, or hafnium (Hf). Alloys of this type are known from EP 0 486 489 B1, EP 0 786 017 B1, EP 0 412 397 B1 or EP 1 306 454 A1.

It is also possible for a, for example, ceramic thermal barrier layer to be present on the MCrAlX, consisting for example of ZrO2, Y2O3-ZrO2, i.e. unstabilized, partially stabilized or fully stabilized by yttrium oxide and/or calcium oxide and/or magnesium oxide.

Columnar grains are produced in the thermal barrier layer by suitable coating processes, such as for example electron beam physical vapor deposition (EB-PVD).

Other coating processes are possible, e.g. atmospheric plasma spraying (APS), LPPS, VPS or CVD. The thermal barrier layer may include grains that are porous or have micro-cracks or macro-cracks, in order to improve the resistance to thermal shocks.

Refurbishment means that, after they have been used, protective layers may have to be removed from heat shield elements 155 (e.g. by sand-blasting). Then, the corrosion and/or oxidation layers and products are removed. If appropriate, cracks in the heat shield element 155 are also repaired. This is followed by recoating of the heat shield elements 155, after which the heat shield elements 155 can be reused.

Moreover, a cooling system may be provided for the heat shield elements 155 and/or their holding elements, on account of the high temperatures in the interior of the combustion chamber 110. The heat shield elements 155 are then, for example, hollow and may also have cooling holes (not shown) opening out into the combustion chamber space 154.

Figure 4:
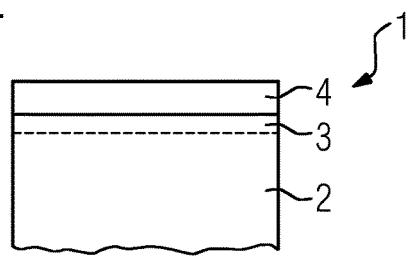
FIG. 4 shows a partial view of a cross section through an embodiment of a compressor blade or vane.

FIG. 4 shows a partial view of a cross section through a compressor blade or vane 1 according to embodiments of the invention. The compressor blade or vane 1 comprises a blade or vane substrate 2, which is produced from a metal alloy and determines the aerodynamic shape of the compressor blade or vane. An aluminum diffusion layer 3 which has been produced by the diffusion of aluminum into the blade or vane substrate 2 is provided on the surface of the blade or vane substrate 2. The aluminum diffusion layer 3 can have a thickness of approximately 20 micrometers and an aluminum content of approximately 0.1% by weight aluminum. Once the aluminum diffusion layer 3 has been produced, a hard material coating 4 is applied to the blade or vane substrate. This can be effected, for example, by vapor deposition, for example by physical vapor deposition. The hard material coating 4 protects the compressor blade or vane 1 from erosion and corrosion. If part of the hard material coating 4 undergoes spalling, the aluminum of the aluminum diffusion layer exposed in this way reacts to form aluminum oxide, which prevents corrosion of the exposed site of the blade or vane substrate 2 and thereby further spalling of the hard material coating 4 promoted by undercorrosion of the adjacent surface regions.

Although the invention has been described and illustrated in greater detail by means of the preferred exemplary embodiment, the invention is not limited by the disclosed examples. Variations thereof can be derived by a person skilled in the art without departing from the scope of protection of the invention as defined by the patent claims which follow.

The invention claimed is:

1. A method for producing a compressor blade or vane, comprising the following steps:
    providing a blade or vane substrate comprising a metal alloy;
    coating the blade or vane substrate with a hard material coating;
    reducing a corrosion of the metal alloy as a result of spalling of the hard material coating by diffusing aluminum into a surface zone of the blade or vane substrate to produce an aluminum diffusion zone such that an aluminum proportion of 0.05 to 0.2% by weight is present in the surface zone, wherein, upon spalling of the hard material coating, the aluminum diffusion zone reacts to form aluminum oxide that protects the metal alloy against the corrosion; and
    wherein the hard material coating comprises at least one of TiN, TiAlN, AlTiN, and CrN as a single-layer ceramic or multi-layer ceramics;
    wherein the aluminum diffusion zone has a thickness of 10 to 24 micrometers.

2. The method of claim 1, wherein the step of diffusing is carried out in such a manner that an aluminum proportion of 0.075 to 0.15% by weight is present in the surface zone.

3. The method of claim 1, wherein, in the step of coating, a step of physical vapor deposition or of thermal plasma spraying is carried out.

4. The method of claim 1, wherein the aluminum diffusion zone has a thickness of 15 to 24 micrometers.

5. The method of claim 1, wherein the aluminum diffusion zone has a thickness of 20 micrometers.

* * * * *